United States Patent

[15] 3,653,991
[45] Apr. 4, 1972

Sirtl et al.

[54] METHOD OF PRODUCING EPITACTIC GROWTH LAYERS OF SEMICONDUCTOR MATERIAL FOR ELECTRICAL COMPONENTS

[72] Inventors: Erhard Sirtl, Midland, Mich.; Hartmut Seiter, Munich, Germany

[73] Assignee: Siemens Aktiengesellschaft, Berlin, Germany

[22] Filed: June 16, 1969

[21] Appl. No.: 833,818

[30] Foreign Application Priority Data

June 14, 1968 Germany ....................... P 17 69 605.8

[52] U.S. Cl. ............................................. 148/175, 117/106
[51] Int. Cl. ......................................................... H01l 7/36
[58] Field of Search .................... 148/175; 117/106 A, 107.2

[56] References Cited

UNITED STATES PATENTS

| | | | |
|---|---|---|---|
| 3,345,209 | 10/1967 | Cheroff et al. | 117/107.2 R |
| 3,425,878 | 2/1969 | Dersin et al | 117/106 A |
| 3,471,326 | 10/1969 | Kappelmeyer et al. | 117/106 A |
| 3,047,438 | 7/1962 | Marinace | 148/175 |
| 3,296,040 | 1/1967 | Wigton | 148/175 |
| 3,345,223 | 10/1967 | Reisman et al. | 148/175 |
| 3,428,500 | 2/1969 | Maeda | 148/175 |
| 3,472,689 | 10/1969 | Scott, Jr. | 148/175 |
| 3,510,369 | 5/1970 | Ernick et al. | 148/175 |

*Primary Examiner*—Delbert E. Gantz
*Assistant Examiner*—G. J. Crasanakis
*Attorney*—Curt M. Avery, Herbert L. Lerner and Daniel J. Tick

[57] ABSTRACT

Homogeneous epitactic growth layers of semiconductor material for electrical components, particularly for integrated circuit, having locally separated regions situated on a crystal wafer, by pyrolitic dissociation of a gaseous compound of the semiconductor material and by precipitating said semiconductor material upon a heated, monocrystalline carrier body which is coated at specific regions of its surface with a masking layer. The method is characterized by the fact that both bromine and hydrogen are included in the reaction gas, shifting the equilibrium of the reaction partners through development of additional hydrogen halide, during the precipitation process at the heated carrier body. Thus precipitation of the semiconductor material, occurs only at the places of the carrier body, not coated with the masking layer, while no semiconductor material is precipitated at the regions of the carrier body which are coated with the masking layer, due to a suppression of the heterogenic seed formation.

5 Claims, 6 Drawing Figures

METHOD OF PRODUCING EPITACTIC GROWTH LAYERS OF SEMICONDUCTOR MATERIAL FOR ELECTRICAL COMPONENTS

The present invention relates to a method for producing homogeneous, epitactic growth layers of semiconductor material for, electrical components, more particularly for integrated circuits, having locally separated regions, situated upon a crystal wafer, by pyrolytic dissociation of a gaseous compound of the semiconductor material precipitating the semiconductor material upon a carrier body, which for the precipitation process, is coated at specific areas of its surface with a masking layer.

To produce integrated circuits wherein several locally separated regions of the surface zone having variable conductance type and very slight layer thickness are placed on a crystal wafer and required for the operation of the circuit, one must resort to the method steps of the planar technique as well as of the epitaxy method. It was customary, heretofore, to produce locally limited regions in an epitactically precipitated surface layer by either producing the doped regions by indiffusion of the dopant down to a required depth, into the base crystal having the opposite conductance type, with the aid of the planar method or to etch the zones, provided for the opposite conductance type, down to appropriate depth, into the base crystal by employing etching and photo techniques known from the planar method. Thereafter the depressions in the base crystal are filled in again with semiconductor material which is epitactically precipitated from the gaseous phase, by adding a dopant that produces the opposite conductance type.

The aforedescribed precipitation of semiconductor material through pyrolysis entails the difficulty that the semiconductor material precipitates not only upon the locations provided for this purpose but also upon surface regions of the carrier body which are provided with a masking layer. Due to the locally variable growth, the uniformity of the layers, precipitated by epitaxy, is considerably worsened by this effect. Hence the growth process must be followed by a mechanical or chemical smoothening process which, in turn, impairs considerably the surface quality of the layer precipitated by epitaxy, thereby, worsening the electrical quality of the finished component.

According to the method of the present invention, these difficulties can be overcome by adding a free halogen, preferably bromine to the reaction gas, which will so influence the equilibrium of the reaction partners through the development of additional hydrogen halides during the precipitation upon the heated carrier body, that a precipitation of the semiconductor material will occur only at the localities not covered by the masking layer, while no semiconductor material will be precipitated at the regions coated with the masking layer due to suppression of the heterogenic seed formation.

It is within the framework of the present invention that due to the selection of a specific higher concentration area of semiconductor halogenide, in combination with the added halogen or the hydrogen halides which evolve, the reaction period is minimumized. The selective epitactic precipitation process can be satisfactorily effected, under the required reaction conditions, such as temperature and/or hydrogen content, only if the duration of the reaction has not yet resulted in a serious alteration of the masking layer (such as undesireable general or locally - limited removal; recrystallization).

Thus, the effect upon which the method of the invention is based can be obtained in the desired manner and to particular advantage if operation is carried out at relatively high partial pressures of the gaseous semiconductor material, but close to the threshold value between removal and growth of the carrier body of substrate. This requires an adequate growth speed and also an optimum reaction period without leaving the critical saturation range, in which precipitation of the semiconductor material is effected upon the specific substrate, but not upon the masking layer. In a substrate material of usual crystal quality, the dislocation density is so great that no seed-formation process is required for a layer buildup. Thus, the knowledge of the critical seed-formation process (supersaturation) on the oxide surface is sufficient for practical application. A simple adjustment of the critical supersaturation is achieved through an addition of bromine, to the reaction gas, which is present at the desired location for precipitation, in the form of hydrogen bromine. A reaction with hydrogen takes place even at low temperatures according to the equation $Br_2+H_2=2HBr$.

A further development of the invention is to use a reaction gas, a mixture comprised of a silicon halide or germanium halide having formula $MX_{4-n}H_n$ and hydrogen, wherein M indicates germanium or silicon, X the halogens, chlorine, bromine and iodine and n can assume values of 0 to 4.

The invention will further be described with respect to the drawing in which,

FIG. 1 is an explanatory graph;

FIG. 2 schematically illustrates apparatus for carrying out the invention;

Figures 1, 2, 3, 4, 5, 6:
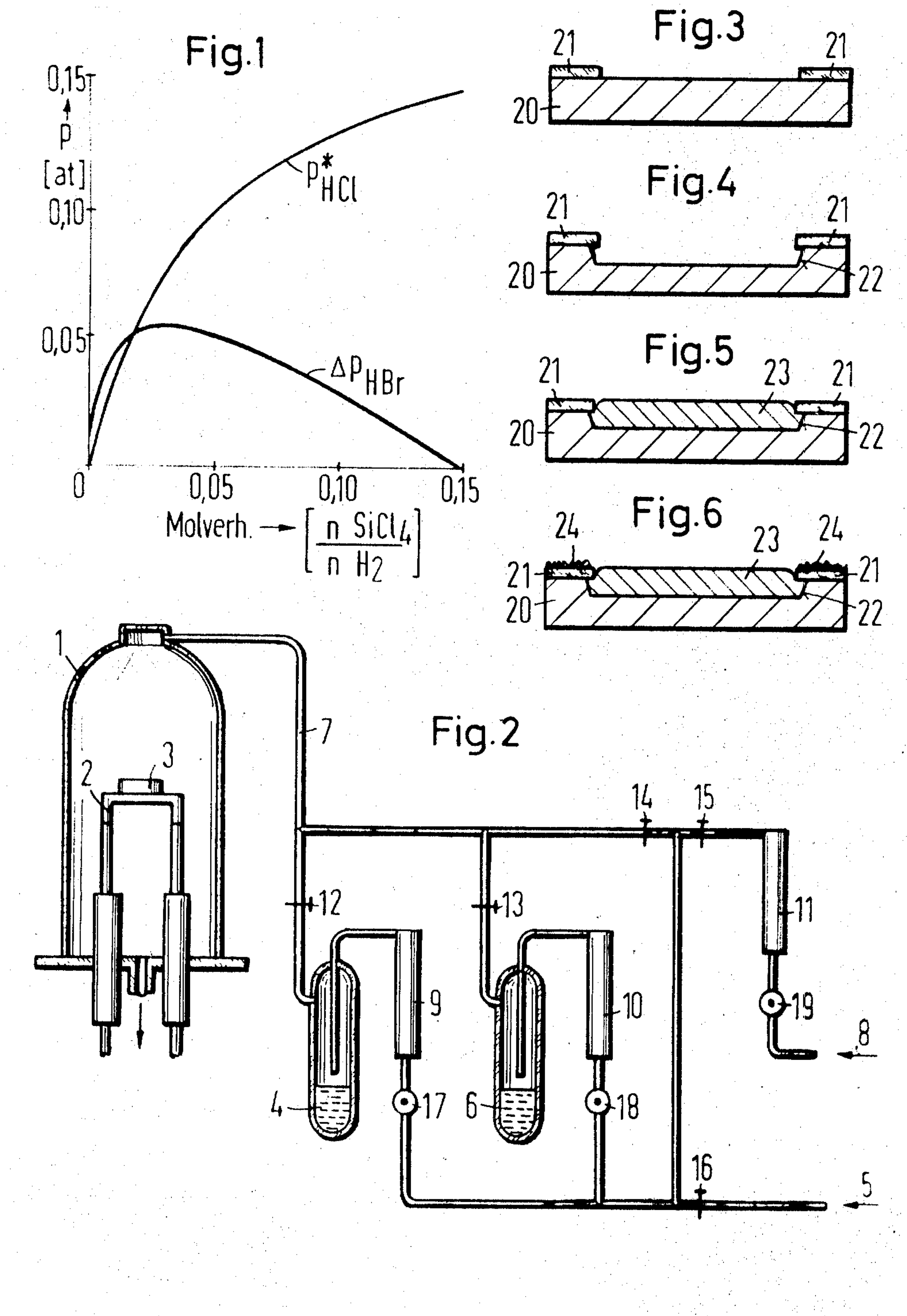
FIGS. 3–5 shows the production of a body according to the invention.
FIG. 6 shows a comparative body if the invention is not used.

FIG. 1 shows an example a comparison of HCl—equilibrium concentration $p^*_{HCl}$ for the reaction of $SiCl_4$ with $H_2$ at approximately 1,200° C. and that of HBr-concentration $\Delta p_{HBr}$, which is needed, in addition, so that a transition of growth to removal of silicon $\eta=0$ could be obtained at various $SiCl_4/H_2$ values. The ordinate is thereby plotted as pressure $p$ in atmospheres (at) and the abscissa is the mol ratio $nSiCl_4/nH_2$. The selected working point (mol ratio $SiCl_4/H_2$) can be further varied by adding inert gas.

Prior to the precipitation of the semiconductor material, a removal of the carrier body can be effected at the locations not coated with the masking layer by either increasing the halogen content of the reaction gas with respect to the concentration provided for precipitation or by reducing the partial pressure of the semiconductor halogenide. Another possibility for removing the carrier body is afforded by increasing the flow velocity of the reaction mixture at otherwise equal reaction conditions or by increasing the carrier temperature.

The halogen, particularly bromine can be evaporated according to the teaching of the invention in a separate evaporation vessel and only then be mixed with the hydrogen. It can also be mixed, at an appropriate mol ratio, with the semiconductor halogenide and then be evaporated. This is especially advantageous, when the removal of the silicon is previously effected in a mixture of liquids. This method step is benefitted for example by the fact that bromine and $SiCl_4$ can be mixed to an unlimited degree, at room temperature, and that their vapor pressures are almost identical. The mixing of the two liquids also offers that advantage that traces of water, contained in the halogen, particularly bromine, are bound as a silicon oxide hydrate. Accordingly, an embodiment example provides that the halogen, particularly bromine, when it is separately evaporated, is combined with slight amounts of semiconductor halogenides.

Naturally, it is possible to add, according to need, arbitrary amounts of respective dopants to the reaction gas so that any desired degree of doping can be adjusted in the grown semiconductor layer.

Preferably, the carrier temperature is set to approximately 1,200° C., more particularly 1,190° C. According to a particularly preferred embodiment example of the present invention, the flow velocity of the hydrogen, serving as a reaction gas and comprised of 1 percent $SiCl_4$ and 2 percent bromine, is adjusted at the reaction locality to 10 to 20 cm./sec. If a removal of the carrier body must be effected prior to the precipitation of the semiconductor material, it can be done in a simple manner by disconnecting the $SiCl_4$ vaporizer but otherwise maintaining the same reaction conditions.

The method can be carried out by using all kinds of masking layers, preferably comprised of $SiO_2$, $Si_3N_4$ and SiC.

The method of the present invention also makes it possible to produce an epitactic layer having a surface of very high quality, thus making mechanical after-treatment unnecessary. Hence, the method according to teaching of the present invention is particularly well suited for the production of integrated circuits employing silicon and germanium as the base material, more particularly for integrated circuits associated with planar and MOS techniques.

FIG. 2 schematically shows a suitable apparatus for performing the method. In this Figure, the reaction chamber 1 is provided for the epitactic coating or removal of the carrier body 3, which is located on a heater 2 and is partly provided with a masking layer. The $SiCl_4$ issuing from the vaporizer 4 is charged with gaseous hydrogen flowing in as schematically shown by arrow 5 and is mixed in the main line 7, ahead of the reaction chamber 1, with the bromine coming in from the vaporizer 6, which is compounded with small amount of $SiCl_4$. For thinning the reaction gas mixture, an inert gas, such as helium, argon or nitrogen, can also be introduced into the supply line of the reaction chamber, at the location marked by arrow 8. An exact adjustment of the flow velocity is effected by the flow meters denoted as 9 (for $SiCl_4$ evaporators), 10 (for bromine evaporators) and 11 (for inert gas). The stopcocks 12 to 16 make it possible to disconnect the individual supply lines, and the needle valves 17 to 19 permit an exact dosing of the gas amounts.

Thus, for example, the evaporator 4 for the $SiCl_4$, was disconnected from the entire supply system by operating the cock 12, thus semiconductor material was removed, at an etching velocity of 0.5 to 1 $\mu$/min, from the evaporator 6, in hydrogen, 1,190° C. and with a bromine content of 1 to 2 percent. Thereafter the cock was reopened and a hydrogen gas, compounded with 1 percent $SiCl_4$ and 2 percent bromine having a linear flow velocity of 15 cm./sec., was used to obtain a growth speed for the epitactic layer amounting to 0.5 $\mu$/min, at a carrier temperature of 1,190° C.

FIGS. 3 to 5 show the production process of a semiconductor body by employing the method of the present invention. Thus 20 denotes the carrier body comprised of the original material, such as p-silicon, whose surface is partly coated with a masking layer 21, comprised of $SiO_2$. FIG. 4 shows the same device following the etching process with, e.g. a reaction gas which contains, in addition to hydrogen, 1 to 2 percent bromine and which has reacted with the heated surface of the carrier body, at 1,150° to 1,200° C. This creates the tub-shaped depression in the carrier body, outlined by line 22. This depression is filled-in, during a subsequent precipitation, by reducing the bromine content, according to the method of the invention and at the same temperature, and by adding to the gaseous semiconductor compound, semiconductor material 23 having an opposite conductance type, as shown in FIG. 5, without causing the semiconductor to precipitate upon the $SiO_2$ layer 21, serving as a masking layer.

In comparison, FIG. 6 shows a device which was produced according to the heretofore customary methods. The same reference numerals are used as in FIGS. 3 to 5. The new reference numerals 24 indicate the undesired polycrystalline deposits on the masking layer.

We claim:

1. In the method of selective precipitation of homogenous epitactic growth layers of semiconductor material for electrical components, comprising locally separated regions situated on a semiconductor crystal, through pyrolytic dissociation of a gaseous compound of the semiconductor material and precipitation of the semiconductor material upon localities of a heated, monocrystalline carrier body, which are not covered by a masking layer selected from $SiO_2$, $Si_3N_4$ and SiC, the improvement which comprises carrying out a selective precipitation upon the heated carrier body by adding bromine to a reaction gas consisting of a silicon halide or germanium halide of formula $MX_{4-n}H_n$ and hydrogen, wherein M denotes germanium or silicon, X a halogen selected from chlorine, bromine and iodine and $n$ is a whole value of 0 to 4, whereby the reaction equilibrium is so influenced under formation of additional hydrogen bromide, during the precipitation on the heated carrier body that semiconductor material precipitates only at the locations of the carrier body not covered by the masking layer.

2. The method of claim 1, wherein the bromine, is evaporated in a separate evaporation vessel and thereafter admixed with hydrogen.

3. The method of claim 1, wherein the bromine, is mixed together with the semiconductor halide in an evaporation vessel, at an appropriate mol ratio, and is then evaporated.

4. The method of claim 1, wherein a small amount of semiconductor halide is added to the halogen, when the latter is separately evaporated.

5. The method of claim 1, wherein at a carrier temperature of approximately 1,200° C., the flow velocity of the reaction gas containing 1 percent $SiCl_4$ 2 percent bromine, and the remainder hydrogen, is adjusted at the locality of the reaction, to 10 to 20 cm./sec.

* * * * *